United States Patent [19]

McKnight

[11] 4,186,611
[45] Feb. 5, 1980

[54] REMOTE CONTROL TV CHANNEL SELECTOR

[76] Inventor: Robert J. McKnight, 10-5 Jamestowne Village, Toms River, N.J. 08753

[21] Appl. No.: 899,522

[22] Filed: Apr. 24, 1978

[51] Int. Cl.² .......... F16D 41/00; H03J 1/00; H01H 17/08
[52] U.S. Cl. .......... 74/10 A; 74/10.15; 74/142; 192/46; 192/95; 325/390
[58] Field of Search .......... 74/10 A, 10.15, 126, 74/138, 141, 142; 192/46, 95; 325/390

[56] References Cited

U.S. PATENT DOCUMENTS

| | | | |
|---|---|---|---|
| 2,899,841 | 8/1959 | Melloy | 192/46 X |
| 3,911,752 | 10/1975 | Olson | 74/10 A |
| 3,949,616 | 4/1976 | Oberti | 74/10 A |
| 4,114,098 | 9/1978 | Booty | 74/10 A X |

Primary Examiner—Allan D. Herrmann

[57] ABSTRACT

A pull-cord acting through a leverage and a linkage actuates the driving element of a 2 element clutch, the driven element containing a slot which is in driving engagement with the tongue of a TV tuner dial. The clutch and an actuating lever are attached to separate clamps which are vertically and rotatably attached to a column affixed to the table or to a plate on which the TV rests. A lever arm attached to the driving element of the clutch is connected by means of a linkage to the parallel arm of an L-shaped actuating lever. A pull on a pull-cord attached to a vertical arm of the actuating lever advances the tuner to the next adjacent channel.

8 Claims, 7 Drawing Figures

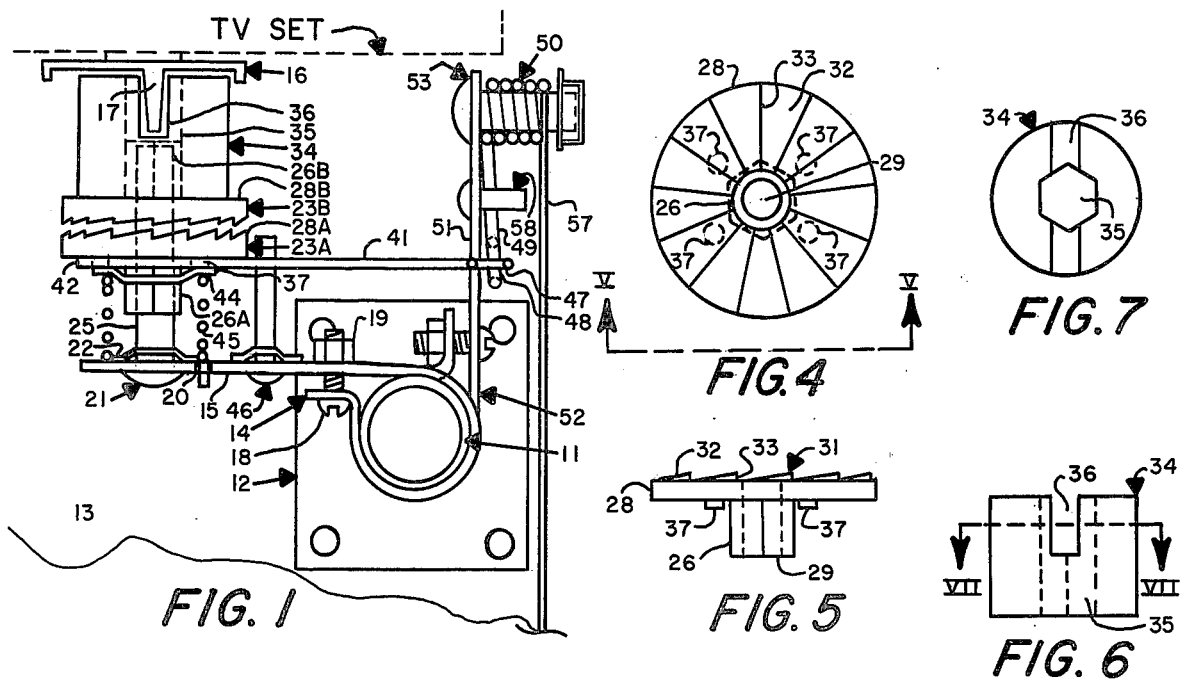
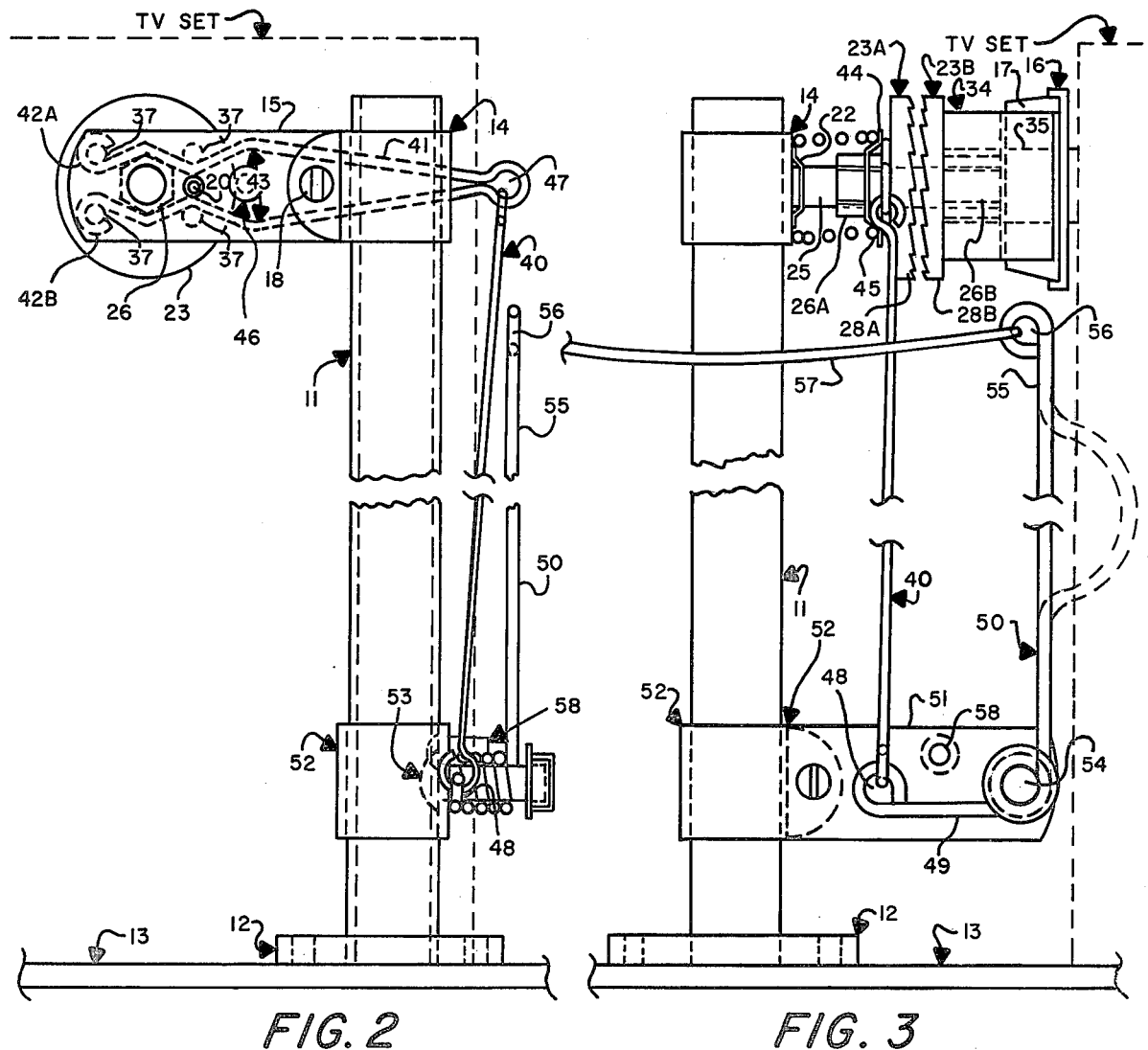

REMOTE CONTROL TV CHANNEL SELECTOR

This invention was disclosed under the Document Disclosure program under title "Remote Control TV Station Selector", filed July 6, 1976, Document No. 050,624, and under title "Improved Remote Control Mechanical TV Station Selector", filed Oct. 25, 1977, Document No. 065,326.

BACKGROUND OF THE INVENTION

Although push-button tuners have recently made their appearance on the market, probably 95% or more of existing TV sets have a rotary tuner. Some of these have been equipped with remote control devices consisting of a battery-powered push-button controlled transmitter strong enough to transmit an electronic signal a distance of 25 to 50 feet. The signal was picked up by a receiver in the TV set which actuated a solenoid which, by means of a ratchet and sprocket, caused the tuner dial to rotate clockwise. If the push-button was pressed and instantly released the tuner advanced one channel. If the button was held down, the tuner continued to rotate until the button was released. With practice, the operator was usually able to stop the rotation of the tuner at the desired channel. However, it more than occasionally ran past the channel intended and the operator had to repeat the cycle.

A more serious drawback was that the receiver frequently responded to stray signals such as those generated by passing trucks, planes flying overhead, or garage door openers.

An additional drawback was that the components had to be installed in the TV set at the time of manufacture and could not readily be salvaged for use on another set.

In addition to the cost, $80.00 to $125.00, these accessories were one more source of possible trouble adding to maintenance cost.

OBJECTS OF THE INVENTION

One object of this invention is to provide a mechanically actuated remote controlled TV channel selector which is simple and inexpensive and which can be installed by the user from simple instructions furnished with the product.

Another object is to provide a remote controlled TV channel selector which requires no physical connection to the TV set, hence can be salvaged and used with a different set, and from which the TV set can be readily removed for use elsewhere.

Still another object is to provide a remote controlled TV channel selector wherein the tuner dial can be manually rotated in either direction to change channels without disengaging the remote controlled channel selector.

A still further object is to provide a remote controlled TV channel selector which applies the principle of mechanical advantage so that the actuation of the channel selector requires very little force so that arthritic and other handicapped and feeble people can operate it.

BRIEF DESCRIPTION OF THE FIGURES

FIG. 1 is a plan view of a remote control TV tuner positioned adjacent to a TV set shown in phantom.

FIG. 2 is a front view of the device of FIG. 1.

FIG. 3 is a side view of the device of FIG. 1.

FIG. 4 is a front view of one of two identical clutch elements.

FIG. 5 is a plan view of clutch element of FIG. 4, along the line V—V in the direction indicated by the arrows.

FIG. 6 is a view of a clevis which is attached to the driven element of the clutch.

FIG. 7 is a cross sectional view of the clevis of FIG. 6 along the plane VII—VII of FIG. 6.

SUMMARY OF THE INVENTION

A device, which includes an indexing clutch consisting of a driving and a driven element, the driven element, or an extension therefrom, being in engagement with the tongue of the tuner dial, is mounted on a shaft or axle positioned normal to the tuner dial. The shaft is attached to an extended arm of a clamp which is rotatably and vertically adjustable on a column affixed to a plate or the table on which the TV set rests. A second clamp at a lower elevation on the column contains an L-shaped lever with a short generally horizontally extended arm and a longer generally vertically extended arm. The free end of the short arm is connected, by means of a flexible cord or linkage to a parallel arm attached to the driving element of the clutch. The free end of the vertical arm of the L-shaped lever has a pull-cord attached thereto. A pull on this cord rotates the clutch approximately 30°, and when the cord is released, a spring on the driving element of the clutch returns this element to its original position.

The clutch is made of two identical plastic parts made in the shape of a shoulder bushing; i.e. with a tubular hub having a flange at one end. The two parts are assembled on a shaft with the flanges facing each other. The adjoining surfaces of the flanges have a plurality of generally wedge-shaped radial teeth so designed that when the driving element is rotated clockwise it drives the driven element clockwise, but when the driving element rotates counter-clockwise the slope of the contacting surfaces of the teeth allow the teeth to slip so that the driven element remains stationary. Preferably these parts are made of nylon or like materials which have a low coefficient of friction.

The number of teeth on the two clutch parts is the same as the number of tuning positions on the tuner, in some cases 13 and in other cases 14. To prevent the parts from disengaging when pressure is applied, the driving and driven faces of the wedges, when rotated clockwise, are normal to the flange surface; or they preferably have a slight undercut so that they tend to lock into the engaged position. The faces of the wedges in contact when the driving part is rotated counter-clockwise are inclined substantially so that the friction between the faces is not sufficient to cause the driven element to rotate.

The driven clutch part has a sleeve fixedly attached to the hub facing the TV dial. This sleeve has a slot which engages the tongue of the tuner dial.

After the channel selector is assembled and affixed to the TV supporting surface, with the clutch approximately opposite the tuner dial, the clamp containing the clutch may be adjusted upward or downward on the column until the shaft on which the clutch is mounted is approximately opposite the center of the tuner dial. The clamp may also be rotated as needed to assure that the shaft is aligned normal to the face of the dial, a slight amount of mis-alignment being permissible. It may be necessary to move the TV set slightly closer or further away from the clutch until the correct distance is reached. A combination compression and torsion spring serves to provide the pressure to hold the clutch elements in proper contact relationship and to return the driving element to its original position after it is actuated by a pull on the pull-cord.

The arm of the clamp on which the shaft is mounted contains also a rivet positioned thereon so that it serves as a stop-pin to control the degree of rotation of the driving element of the clutch. This pin extends into an opening in the actuating arm of the driving element. This opening can be a hole punched in a metal strip if the arm is made of sheet metal. Preferably the arm is made of formed wire and an opening of the desired size and configuration may be provided where the stop-pin projects through the arm. Formed wire is preferable also because it can be easily bent to modify the size and shape of the opening.

To accomplish the necessary 360°/13 of rotation required to index a 13 tooth clutch requires that the opening in the actuating arm permit slightly less the 28° of rotation, and to index a 14 tooth clutch requires that the opening permit slightly less than 26° of rotation. However, this clutch design will function perfectly for both the 13 and 14 tooth clutches even if the opening allows 35° to 40° of rotation, provided the excess overtravel is on the return stroke. Therefore, a single design of actuating arm with an oversize opening can be used. It is preferable that the arc of rotation be no greater than needed to provide satisfactory operation. Hence, it is desirable to adjust or fine tune the amplitude of the opening by expanding or compressing the wire form at the point of contact with the rivet.

It is preferable also to make the L-shaped lever out of wire which can be bent as needed to obtain many advantages. For example, the long arm can be made excessively long to provide increased mechanical advantage thus reducing the force required to actuate the channel selector; as might be helpful to feeble and handicapped persons, or those suffering from arthritis, many of whom are unable to change the channel on their TV. Those who want it shorter can cut off or break off a portion and, with pliers, form a new loop to accept the pull-cord. Or, they can bend it into various shapes to lower the pull-cord loop, thus reducing the effective lever arm and shortening the pull-cord strokes.

The column is preferably of circular cross-section and can be of any material such as metal, plastic, wood, or paper. It can be inserted into a base and secured to the surface on which the TV set is supported. If holes are provided in the base, screws can be used to affix the base to a plate of hardboard, particle board, or the like, or even to the table on which the TV set rests. Alternatively, the base can be furnished with pressure-sensitive adhesive, with a removable cover strip, which needs only to be pressed into position. The assembly can be preadjusted and positioned with the slot in driving engagement with the tongue of the tuning dial after which the location of the column base can be marked on the plate. Then the cover strip can be removed and the column placed in the marked position. Further adjustments can be made by loosening the upper clamp and adjusting the rotational and vertical position to obtain the alignment and spring pressure which produces the best performance. In assembling the lower clamp, it should be positioned slightly higher than necessary to permit space for the short arm of the L-shaped lever to operate without bottoming on the base plate. After the top clamp is adjusted properly, the bottom clamp can be lowered until the connecting link is taut, thus removing the slack in the linkage.

DESCRIPTION OF A PREFERRED EMBODIMENT

Referring to the drawings, FIGS. 1, 2 and 3, a cylindrical column 11 is affixed as with adhesive to a preferably rectangular base plate 12 which in turn is attached, by means of adhesive or screws, to a flat plate 13 of hardwood, particle board or the like on which the TV set is placed. A clamp 14 having an extended arm 15 is positioned on column 11 at the approximate level of the axis of the TV tuner dial 16 containing an outwardly projecting tongue 17. Clamp 14 is held in vertical and axial position on column 11 by adjustment screw 18 and nut 19.

Near the free end of arm 15 is a rivet 21 retained on arm 15 by means of a push-on fastener 22. The clutch consisting of a driving element 23A and a driven element 23B are rotatably mounted on the shank or stud 25 of the rivet 21. These elements are identical in shape, being shown in detail in FIGS. 4 and 5, consisting of a hub 26 and a flange 28 with a circular hole 29 through the axis. In FIGS. 1 and 3, the parts of the driving element are identified by suffix A and the driven element by suffix B in order to distinguish between them. The exterior surfaces of the hubs are hexagonal in shape. On the outer face of each flange there is a plurality of wedge-shaped radially disposed teeth 31, the number of teeth being equal to the number of index positions on the TV tuner, at present either 13 or 14.

Each tooth 31, as shown clearly in FIG. 4, has a flat surface 32 inclined slightly from a plane normal to the stud 25 and a flat surface 33 perpendicular to or inclined slightly from the perpendicular to said plane, the inclination being such that it decreases the contained angle between the surfaces 32 and 33. The teeth are so designed that when the two clutch elements are pressed together the surfaces 32A and 32B of the driving element and driven element respectively are in a common plane and the two surfaces 33A and 33B are also in a common but different plane.

Clutch elements 23A and 23B are installed on the rivet stud so that the outer faces of the flanges face each other. When the teeth are interlocked, and the driven element 23A is rotated clockwise, element 23B is driven in a clockwise direction. However, when the driving element is rotated counter-clockwise, the surfaces 32A and 32B slip against one another, especially if the parts are made of nylon or Delrin or the like as is preferred, the driven element remaining stationary.

A clevis 34, as shown in detail in FIGS. 6 and 7, which is a cylindrical-shaped part with a hexagon-shaped inner bore 35, said bore being identical in shape and dimensions to the outer surface of the hub 26B of the driven clutch element 23B, said clevis having a slot 36 in one end thereof, is pressed onto the hub 26B of the driven element 23B and secured by any means, such as adhesive. In the operating position, the slot 36 encompasses and engages the tongue 17 of the tuner dial 16, so that a clockwise rotation of the clutch produces a clockwise rotation of the dial. The clevis could be made an integral part of the driven element of the clutch, if desired.

An actuating arm 41, preferably formed of wire, is attached to the driving element 23A of the clutch. As a means of preventing relative movement between the two parts, element 23A is provided with 4 prongs 37 projecting from the inner surface of the flange 28A, the loops 42A and 42B of arm 41 being wrapped partway around one of said prongs, and the portion of the arm 41 adjacent to the loops 42A and 42B are formed to wrap partway around the hexagon-shaped hub of the clutch driving element 23A. A push-on fastener 44 holds the actuating arm flush against the inner surface of the flange of element 23A.

The push-on fastener 44 has a plurality of inwardly disposed prongs, the spaces between which are used to anchor one projecting end of a combination compression and torsional coil spring 45, the other end being anchored by a hole 20 in the arm 15 of clamp 14.

The shank of rivet 46, inserted in arm 15 of clamp 14, projects through the opening 43 of actuating arm 41 thus constricting the amplitude of the rotation of arm 41 to approximately 30°. When and if desired, the opening can be made wider or narrower by deforming the wire to permit a greater or lesser degree of rotation.

The spring 45 holds the two elements 23A and 23B of the clutch in engagement and, at the same time, provides the force to return the driving element 23A to its starting position after the clutch has been actuated by a downward pull on the actuating arm 41.

The compression force of the spring 45 can be changed by moving the TV away from the clutch or by rotating the clamp 14, and the torsional force of said spring can be changed by inserting the end of the spring adjacent to the clutch in a different space or opening between prongs of fastener 44.

An adjustable cable or cord 40 connects the loop 47 at the end of actuating arm 41, which normally extends outwardly from the axis of the clutch at an inclined angle of about 150°, to a loop 48 in the short arm 49 of an L-shaped lever 50, preferably formed from wire, which is pivotally attached to the extended arm 51 of a clamp 52 by means of a rivet 53 passing through the opening 54 provided by a coil formed by a plurality of contiguous loops.

The longer arm 55 of the L-shaped lever 50 extends generally vertically from the fulcrum. At the free end of the arm 55 there is a loop 56, attached to which is a pull-cord 57. A pull on this cord causes the lever 50 to rotate counter-clockwise which causes the actuating arm 41 to rotate clockwise which in turn causes the clutch and the tuning dial to rotate clockwise, thus advancing the channel selector to the next adjacent channel. When the tension on the pull-cord 57 is released, the actuating arm 41 and L-shaped lever 50 return to their original positions and the operation may be repeated.

If it is desired to rotate the tuning dial counter-clockwise, this may be done by compressing the actuating arm 41 against the arm 15 to disengage the driving element 23A from the driven element 23B and turning the tuning dial in whichever direction is desired. For this purpose, a knurled dial, not shown, containing the channel numbers may be inserted between the driven clutch element 23B and the clevis 34.

The arm 55 of L-shaped lever 50 can be made as long as desired to provide any required mechanical advantage, but the longer the arm, the greater is the length of the pull required to rotate the tuner one channel spacing. This is desirable for users who require this feature. However, for those who object to a long pull, the L-shaped arm may be deformed, as by forming an interior loop as shown in phantom in FIG. 3, thus shortening the pull required.

A pin or rivet 58, inserted in arm 51 of clamp 52, serves as a stop limiting the amplitude of the arc traversed by arm 49 of the L-shaped lever 50 on its return stroke.

While particular embodiments of this invention have been shown in the drawings and described herein, it will be apparent that many changes may be made in the form, arrangement and positioning of the various elements of the combination. In consideration thereof it should be understood that preferred embodiments of this invention disclosed herein are intended to be illustrative only and not intended to limit the scope of the invention.

Having thus described and defined my improvement in remote control TV channel selectors, I now proceed to itemize the claims which I consider to be new, novel, and worthy of a patent.

I claim:

1. An indexing clutch for rotating, in pre-determined arctual increments, a TV channel selector tuner, said clutch consisting of two sleeves rotatably contained on a common shaft fixedly positioned normal to the channel selector dial, coaxially aligned with the center thereof, each sleeve having, on adjacent ends thereof, a plurality of opposed generally wedge-shaped radial teeth which interlock when the driving sleeve is rotated counter-clockwise, the number of teeth on each sleeve being equal to the number of channel positions on the tuner whereby rotating the clutch one ratchet space rotates the tuner one channel space, the driven sleeve being in driving engagement with the tuner.

2. A clutch as described in claim 1 wherein the means for engaging the driven sleeve with the tuner consists of a clevis affixed to the driven sleeve with the slot of the clevis cooperatively engaged with the tongue of the tuner dial.

3. A clutch as described in claim 2 with means for rotating the driving sleeve clockwise one ratchet space at a time and spring means for returning said sleeve to its original position.

4. A TV channel selector having a clutch as described in claim 2 wherein the means for rotating the driving sleeve is a force acting through a lever arm attached to said sleeve, the force being exerted by mechanical, electrical, pneumatic or hydraulic means.

5. A TV channel selector as described in claim 4 wherein the said force is exerted on said lever arm by a pull-cord attached to a generally vertical arm of an L-shaped lever, the other arm, generally horizontal, of the L-shaped lever being connected by a linkage to the lever arm attached to said driving sleeve.

6. A TV channel selector as described in claim 5 wherein the shaft on which the clutch sleeves rotate is affixed to an outstanding horizontal arm of a rotatably and vertically adjustable first clamp attached to a vertical column secured at its base to a plane surface on which the TV set rests and the L-shaped lever is pivotally attached to an outstanding horizontal arm of a rotatably and vertically adjustable second clamp attached to said column.

7. A TV channel selector as described in claim 6 wherein there is no physical connection between the TV set and the mechanism of the remote control channel selector and wherein the TV set can be instantly lifted out of engagement with the actuating mechanism of the remote control channel selector without the need for tools of any kind.

8. A remote control TV channel selector as described in claim 7 wherein, if desired, the tuner dial can be rotated freely in either direction without moving the TV set.

* * * * *